United States Patent [19]

Goodman et al.

[11] Patent Number: 4,489,103
[45] Date of Patent: Dec. 18, 1984

[54] SIPOS DEPOSITION METHOD

[75] Inventors: Alvin M. Goodman, Princeton Township, Mercer County; Herman F. Gossenberger, North Brunswick Township, Middlesex County, both of N.J.

[73] Assignee: RCA Corporation, New York, N.Y.

[21] Appl. No.: 532,973

[22] Filed: Sep. 16, 1983

[51] Int. Cl.³ ............................................. B05D 5/12
[52] U.S. Cl. ....................................... 427/85; 427/86; 427/95; 427/255; 427/255.3
[58] Field of Search ...................... 427/255.3, 255, 85, 427/82, 87, 86, 95, 9

[56] References Cited

U.S. PATENT DOCUMENTS

| | | | |
|---|---|---|---|
| 3,900,597 | 8/1975 | Chruma et al. | 427/82 |
| 4,014,037 | 3/1977 | Matsushita et al. | 357/52 |
| 4,239,811 | 12/1980 | Kenlage | 427/255.3 |
| 4,339,471 | 7/1982 | Kaganowicz et al. | 427/255.3 |
| 4,371,587 | 2/1983 | Peters | 427/255.3 |
| 4,388,342 | 6/1983 | Suzuki et al. | 427/9 |

OTHER PUBLICATIONS

"Crystallographic Study of Semi-Insulating Polycrystalline Silicon (SIPOS) Doped With Oxygen Atoms", M. Hamasaki et al., Journal of Applied Physics 49(7), Jul. 1978, pp. 3987-3992.

"Electronic Properties of Semi-Insulating Polycrystalline-Silicon (SIPOS) Doped With Oxygen Atoms", M. Hamasaki et al., Solid State Communications, vol. 21, pp. 591-593, 1977.

"An Analysis of LPCVD System Parameters for Polysilicon, Silicon Nitride and Silicon Dioxide Deposition", William A. Brown et al., Solid State Technology, Jul. 1979, pp. 51-58.

"Low Pressure CVD Production Processes for Poly, Nitride, and Oxide", Richard S. Rosler, Solid State Technology, Apr. 1977, pp. 63-70.

Primary Examiner—Sadie L. Childs
Attorney, Agent, or Firm—Birgit E. Morris; Donald S. Cohen; Kenneth R. Glick

[57] ABSTRACT

A plurality of wafers is serially disposed between a reactant gas inlet portion and an exhaust gas outlet portion of a deposition chamber. The reactant gas comprises a predetermined mixture of N₂O and SiH₄, and a positive, monotonically decreasing temperature gradient is provided between the wafer closest to the inlet portion to the wafer closest to the outlet portion, such that the thickness and resistivity of the deposited SIPOS (semi-insulating polycrystalline silicon) are substantially similar on each wafer.

4 Claims, 2 Drawing Figures

SIPOS DEPOSITION METHOD

The present invention relates to the chemical vapor deposition of semi-insulating polycrystalline silicon (SIPOS). More particularly, it relates to a method for forming SIPOS films in a semiconductor device production line environment wherein substantially uniform wafer-to-wafer quality is required.

BACKGROUND OF THE INVENTION

SIPOS, a material comprising polycrystalline silicon and oxygen, is commonly used to passivate the surfaces of a semiconductor device. The physical properties of this material are elaborated upon in U.S. Pat. No. 4,014,037, SEMICONDUCTOR DEVICE, T. Matsushita et al., Mar. 22, 1977; in "Crystallographic study of semi-insulating polycrystalline silicon (SIPOS) doped with oxygen atoms", M. Hamasaki et al., J. Appl. Phys. 49(7), July 1978, pp. 3987–3992; and in "Electronic Properties of Semi-Insulating Polycrystalline-Silicon (SIPOS) Doped with Oxygen Atoms", M. Hamasaki et al., Solid State Communications, Vol. 21, No. 6, 1977, pp. 591–593.

SIPOS is typically deposited in a chemical vapor deposition (CVD) system and it is frequently deposited at less than atmospheric (i.e., at "low") pressure. Examples of such low-pressure chemical vapor deposition (LPCVD) systems can be found in U.S. Pat. No. 3,900,597, SYSTEM AND PROCESS FOR DEPOSITION OF POLYCRYSTALLINE SILICON WITH SILANE IN VACUUM, J. L. Chruma et al., Aug. 19, 1975; in "An Analysis of LPCVD System Parameters for Polysilicon, Silicon Nitride and Silicon Dioxide Deposition", W. A. Brown et al., Solid State Technology, July 1979, pp. 51–58; and in "Low Pressure CVD Production Processes for Poly, Nitride, and Oxide", R. S. Rosler, Solid State Technology, April 1977, pp. 63–70.

The method of the present invention can be performed in conventional low pressure deposition systems. These systems typically comprise a tube-shaped deposition chamber which is axially surrounded by heater elements, a reactant gas inlet portion at one end of the deposition tube, and an exhaust gas outlet portion at the opposite end of the deposition tube. Wafers on which the deposition is to be formed are serially arranged between the inlet portion and the outlet portion.

During the deposition process, a reactant gas (or mixture of reactant gases) is admitted to the deposition tube through the inlet portion, flows over the wafers within the tube, and exhausts through the outlet portion. To compensate for depletion of certain components of the reactant gas(es) along the length of the deposition tube, the power to the heater elements which surround the tube may be adjusted so as to provide a particular temperature profile.

For example, when depositing polycrystalline silicon from a silane reactant gas, the silane depletes as it flows from the inlet portion to the outlet portion. If the temperature profile within the tube is uniform, then a relatively thick polycrystalline silicon deposit occurs on the wafers near the inlet portion and a relatively thin deposit occurs on wafers near the outlet portion. In order to remove this thickness variation, the furnace is typically profiled to provide a linear temperature increase from the inlet portion to the outlet portion. Since the rate of silicon deposition increases with deposition temperature, such a temperature profile results in a substantially uniform wafer-to-wafer deposition thickness.

SIPOS is typically deposited from a reactant gas mixture comprising $SiH_4$ and $N_2O$. The volume ratio of $N_2O$ to $SiH_4$, known as $\gamma$, determines the oxygen content, and hence the resistivity of the deposited film. When forming SIPOS on a plurality of wafers, it is naturally desirable to achieve a similar film, from the standpoint of thickness and resistivity, on each wafer. However, the use of the constant temperature gradient (i.e., a linear temperature profile) which effects a substantially uniformly thick silicon deposit from a silane reactant gas, is not effective as a technique for forming a SIPOS film which is uniformly thick and uniformly resistive wafer-to-wafer. The extent of the thickness and resistivity non-uniformity is further accentuated in a high throughput, production-line environment. In such an environment, the number and size of the wafers within the deposition tube provide a deposition area which is relatively large, causing certain components of the reactant gas mixture to be significantly depleted before reaching the outlet portion of the tube.

SUMMARY OF THE INVENTION

A SIPOS deposition chamber having a reactant gas inlet portion and an exhaust gas outlet portion is provided. A plurality of wafers is serially arranged between the inlet portion and the outlet portion and a reactant gas mixture, comprising $N_2O$ and $SiH_4$, flows from the inlet portion to the outlet portion. A positive, monotonically decreasing temperature gradient is created between the wafer nearest the inlet portion and the wafer nearest the outlet portion, such that the thickness and resistivity of the deposited SIPOS is substantially similar on each wafer.

DETAILED DESCRIPTION

Figure 1A:
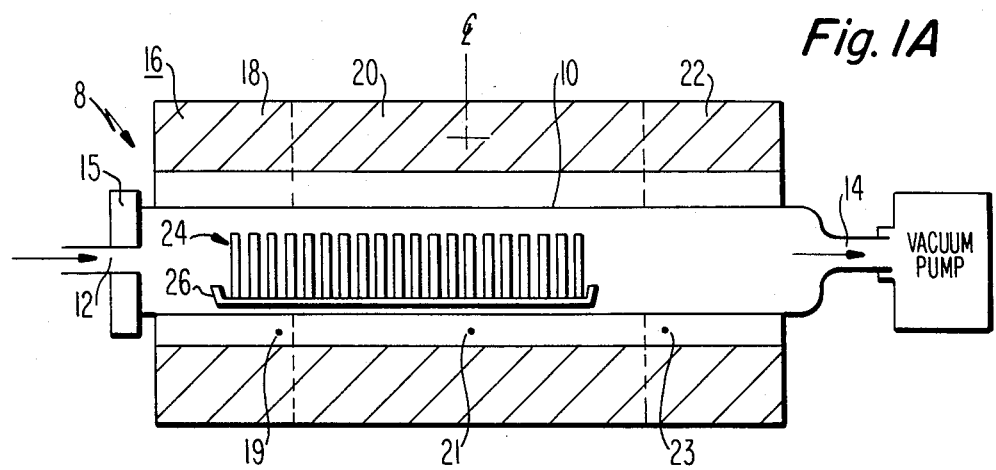
FIG. 1A illustrates a plurality of wafers disposed within a deposition chamber.

An example of a convention low pressure chemical vapor deposition apparatus in which the process of the present invention can be performed is identified as 8 in FIG. 1A. A deposition chamber 10, which in the preferred embodiment is tube-shaped, is provided, and incorporates a reactant gas inlet portion 12 at one end thereof and an exhaust gas outlet portion 14 at the opposite end thereof. In the illustrated apparatus 8, the deposition chamber 10 includes a door 15 in which the reactant gas inlet portion 12 is located. Alternatively, the inlet portion 12 need not be in the door 15 but may be located adjacent thereto.

Axially surrounding the chamber 10 is a heater 16 which is typically composed of several adjacent, independently controllable, resistance heater elements. In the illustrated embodiment, first, second and third heater elements 18, 20, and 22 are sequentially arranged along the axis of the deposition chamber 10 from the inlet portion 12 to the outlet portion 14. Additionally, as shown, the heater elements need not be of uniform length. In the illustrated embodiment, the first and third heater elements 18 and 22 are each shorter than the second heater element 20 located therebetween. Since the temperature of each heater element is independently controllable a variety of temperature profiles can be generated within the deposition chamber.

A plurality of thermocouples is typically provided to facilitate temperature profiling. In the illustrated embodiment, first, second and third thermocouples 19, 21 and 23 are located between the chamber 10 and the heater 16, and are arranged sequentially from a portion near the inlet portion 12 to a position near the outlet portion 14. The specific configuration of the heater elements and thermocouples in the apparatus 8 of the preferred embodiment is summarized below. It should readily be recognized, however, that a variety of functionally equivalent configurations may be suitable as well. The indicated thermocouple locations represent distances along the heater 16 axis relative to the center of the second heater element 20. A negative number represents a location closer to the inlet portion 12, and a positive number represents a location closer to the outlet portion 14.

First Heater Element 18 Length: 12½ inches
Second Heater Element 20 Length: 33⅓ inches
Third Heater Element 22 Length: 12½ inches
First Thermocouple 19 Location: −19¾ inches
Second Thermocouple 21 Location: 0
Third Thermocouple 23 Location: +19¾ inches Within the deposition chamber 10 a plurality of wafers 24 are serially arranged between the inlet portion 12 and outlet portion 14. The wafers 24 are typically disposed on a carrier means 26 to facilitate wafer handling. The carrier means 26 might comprise, for example, a boat having a plurality of slots, each slot being adapted to hold a circular wafer in a substantially vertical position. Thus a plurality of wafers 24 might be oriented in a parallel and sequential fashion within the deposition chamber 10. Ingress and egress to the chamber is made via the door 15.

During SIPOS deposition, the reactant gas mixture comprising $N_2O$ and $SiH_4$ is introduced at the gas inlet portion 12 and the depleted reactant gas mixture is exhausted at the gas outlet portion 14. Flow through the chamber 10 is created by a vacuum pump connected to the outlet portion 14. It should be noted, however, that the gas inlet and outlet portions 12 and 14 shown in FIG. 1A are schematic in nature. In an actual deposition chamber, for example, there may be plurality of reactant gas inlets in a variety of geometric configurations and each of the reactant gases might be admitted through an independent inlet. The illustrated inlet and outlet portions are merely representative of a deposition chamber wherein gas flows over a serial arrangement of wafers from an inlet portion to an outlet portion.

Figure 1B:
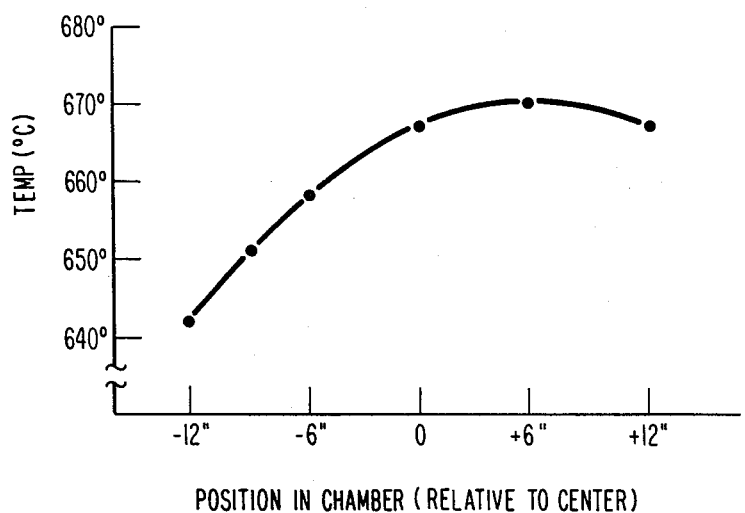
FIG. 1B graphically illustrates the temperature profile to which the wafers are exposed. the graph of FIG. 1B corresponds to the illustration in FIG. 1A in that the abscissa corresponds to the illustrated wafer position within the deposition chamber.

During the deposition sequence, the wafers 24 are subjected to a temperature profile which has a positive yet monotonically decreasing temperature gradient from the wafer closest to the inlet portion (the first wafer) to the wafer closest to the outlet portion (the last wafer). As illustrated in FIG. 1B, the temperature profile, as one sequentially moves from the position of the first wafer to the position of the last wafer, has a positive yet constantly decreasing slope. A non-constant gradient within the chamber 10 can readily be achieved by manipulating the temperature of each of the heater elements 18, 20, and 22. To further facilitate achieving the desired positive monotonically decreasing gradient across the wafers, the carrier means 26 can be positioned closer to the inlet portion 12 than to the outlet portion 14.

In the preferred embodiment, the last wafer is located at or near the location of the peak chamber temperature. For example, the first wafer in the sequence might be located at a position 12 inches before the center of the second heater element 20, and the last wafer might be located 6 inches after the center. With the wafers in this position, the desired gradient across the wafers can be obtained by adjusting the heater element temperature controllers to yield temperatures of 647° C. at the first thermocouple 19, 669° C. at the second thermocouple 21, and 664° C. at the third thermocouple 23.

It should be noted that although these thermocouple temperatures create the temperature profile shown in FIG. 1B, the graph in FIG. 1B does not represent thermocouple values. The profile illustrated in FIG. 1B is determined by an independent thermocouple probe or plurality of probes (not illustrated) positioned at various points within the chamber 10. Although these independent thermocouple measurements are taken at atmospheric pressure, it is assumed that the temperature profile produced is substantially identical to the actual profile which occurs during the deposition sequence.

During the SIPOS deposition, pressure within the chamber 10 is approximately 200–300 millitorr. To produce a film having a thickness of 0.55±0.05 microns and a resistivity of 4 to $12 \times 10^7$ ohm-cm, an $SiH_4$ flow rate of 66 cc/min, and an $N_2O$ flow rate of 14.8 cc/min (yielding a $\gamma$ of 0.224) can be used. The temperature at the position of the first wafer is approximately 640° C., and the temperature at the last wafer position is approximately 670° C.

We hypothesize that the indicated temperature profile results in uniformity in thickness and resistivity because the two reactant gases deplete at different rates. When a conventional, positive constant gradient is used between the inlet portion and outlet portion, the SIPOS film which results is nonuniform wafer-to-wafer. Although the film thickness is substantially uniform, the film resistivity is relatively low on wafers near the outlet portion and is relatively high on wafers near the inlet portion. We hypothesize that this resistivity nonuniformity occurs because $N_2O$ is depleted from the reactant gas mixture at a disproportionately higher rate than that at which the $SiH_4$ is depleted. Thus, if a positive constant gradient is used, with regard to the wafers disposed near the outlet portion of the chamber there is enough $SiH_4$ present in the reactant gas mixture to provide a film of uniform thickness, but there is not enough $N_2O$ present to form a film or similar resistivity to that formed on the initially deposited wafers. We discovered that this can be compensated for by providing decreasingly higher temperatures (i.e., a positive monotonically decreasing gradient) in the chamber.

The method of the present invention is of particular value in a manufacturing environment wherein high throughput is desired and the maximum capacity of the deposition chamber is being utilized. In such a case, the nonuniformity in either thickness or resistivity can be severe if a positive monotonically decreasing temperature gradient is not used. If one uses a conventional, positive constant temperature gradient in an environment where the reactant gas mixture is significantly depleted before reaching the outlet portion of the chamber, a uniformly thick SIPOS deposition could be produced, but the SIPOS resistivity would have a large variation, dependent upon wafer location within the chamber. Our discovery, of the existence of a temperature distribution which can produce films of uniform thickness and uniform resistivity, can thus significantly enhance SIPOS deposition in a manufacturing environment.

What is claimed is:

1. In a method for vapor depositing semi-insulating polycrystalline silicon on a plurality of wafers disposed within a deposition chamber, wherein the wafers are serially arranged between a reactant gas inlet portion and an exhaust gas outlet portion, and wherein the reactant gas comprises a predetermined mixture of $N_2O$ and $SiH_4$, the improvement comprising:

providing a positive, monotonically decreasing temperature gradient between the wafer closest to the inlet portion and the wafer closest to the outlet portion, such that the thickness and resistivity of the deposited semi-insulating polycrystalline silicon are substantially similar on each wafer.

2. A method in accordance with claim 1 wherein said temperature gradient varies between approximately 640° C. and 670° C.

3. A method in accordance with claim 1 wherein said deposition chamber is surrounded by a plurality of heater elements which are arranged serially between the gas inlet portion and the gas outlet portion and wherein:

the plurality of wafers is disposed in closer proximity to the gas inlet portion than to the gas outlet portion.

4. A method in accordance with claim 1 wherein the wafer closest to the outlet portion is located near the point of peak temperature within the chamber.

* * * * *